United States Patent
Fung et al.

(10) Patent No.: US 6,771,092 B1
(45) Date of Patent: Aug. 3, 2004

(54) NON-CONTACT MOBILE CHARGE MEASUREMENT WITH LEAKAGE BAND-BENDING AND DIPOLE CORRECTION

(76) Inventors: Min-Su Fung, 172 Barmore Rd., Lagrangeville, NY (US) 12540; Roger L. Verkuil, 37 Sherwood Hts., Wappinger Falls, NY (US) 12590; Gregory S. Horner, 3717 Carlysle Ave., Santa Clara, CA (US) 95051; William H. Howland, 129 Southdale Blvd., Cortland, OH (US) 44410

( * ) Notice: Subject to any disclaimer, the term of this patent is extended or adjusted under 35 U.S.C. 154(b) by 0 days.

(21) Appl. No.: 10/298,778

(22) Filed: Nov. 18, 2002

Related U.S. Application Data

(62) Division of application No. 08/847,644, filed on Apr. 30, 1997, now Pat. No. 6,522,158.

(51) Int. Cl.[7] .............................................. G01R 31/02
(52) U.S. Cl. ....................................... 324/765; 324/750
(58) Field of Search ................................ 324/765, 769, 324/501, 767, 750, 751, 752, 71.3; 438/14–17, 18

(56) References Cited

U.S. PATENT DOCUMENTS

| | | |
|---|---|---|
| 4,326,165 A | 4/1982 | Szedon |
| 4,812,756 A | 3/1989 | Curtis et al. |
| 5,216,362 A | 6/1993 | Verkuil |
| 5,498,974 A | 3/1996 | Verkuil et al. |
| 5,767,693 A | 6/1998 | Verkuil |
| 5,834,941 A | 11/1998 | Verkuil et al. |

OTHER PUBLICATIONS

Solid State Technology, Test/Measurement, "Monitoring Electrically Active Contaminants to Assess Oxide Quality", Gregory S. Horner, et al., Jun. 1985, PennWell Publishing Company, 4 pages.

Semiconductor International, "A New Approach for Measuring Oxide Thickness", Tom G. Miller, Jul. 1995, Cahners Publishing Company, 2 pages.

"COS Testing Combines Expanded Charge Monitoring Capabilities with Reduced Costs", Michael A. Peters, Semiconductor Fabtech 95, 4 pages.

Process Monitoring, "Corona Oxide Semiconductor Test", Semiconductor Test Supplement, Feb./Mar. 1995, pp. S–3 and S–5.

"Quantox™ Non–Contact Oxide Monitoring System", John Bickley, 1995 Keithley Instruments, Inc., No. 1744, 6 pages.

*Primary Examiner*—Vinh P. Nguyen
(74) *Attorney, Agent, or Firm*—Pearne & Gordon LLP

(57) ABSTRACT

Corona charges are used to bias a wafer to push down mobile charges and then pull them up during temperature cycles. Mobile charge is measured from the drops in the corona voltage due to the mobile charges. Corrections are made in the measurements for dipole potentials, leakage and silicon band-bending.

1 Claim, 1 Drawing Sheet

NON-CONTACT MOBILE CHARGE MEASUREMENT WITH LEAKAGE BAND-BENDING AND DIPOLE CORRECTION

This application is a divisional application of U.S. patent application Ser. No. 08/847,644, filed Apr. 30, 1997. now U.S. Pat. No. 6,522,158.

BACKGROUND OF THE INVENTION

The present invention relates to the field of semiconductor wafer testing and, more particularly, to a non-contact method for testing such wafers.

In the semiconductor industry, the behavior of FET and bipolar devices used to fabricate integrated circuits are very sensitive to induced charges on the silicon wafers. These induced charges can result from static charging of insulator surfaces, poorly formed oxide/silicon interfaces and excessive ionic contamination within the insulator bulk.

The-most prevalent source of ionic contamination is sodium. Other less prevalent sources are potassium and lithium. Some sources of sodium can be contaminated quartz ware, incompletely removed photoresist and inadvertent human contact. The common approach to test for sodium contamination is the use of various MOS monitoring techniques. Bias temperature stressing methods are used to electrically quantify the concentration of sodium in insulator layers (usually thermal oxides). The sodium is forced to move down and up in the oxide layer (push-down and pull-up) and then the sodium is either detected as: (1) a change in net charge imaged on the silicon surface (before and after sodium, movement) or (2) a change in integrated ionic current (before and after sodium movement) or (3) as a momentary ionic current (during sodium movement).

Although widely accepted, the MOS methods have increasingly unacceptable high cost and excessive time associated with the MOS sample preparation. For monitoring thick oxides, the sample preparation time for aluminum MOS electrodes can be 1–2 days and; for thin oxides, the cost and time for fabricating polysilicon electrodes is even worse. Furthermore, the fabrication process for these MOS electrodes can become a source for sodium or other measurement complications.

U.S. Pat. No. 5,498,974, which is incorporated herein by reference, teaches a method and apparatus for measuring mobile charge in an oxide layer on semiconductor wafers using corona charge.

A corona gun is used to deposit a measured quantity of charge on the oxide surface and then a Kelvin probe is used to measure the potential of the oxide surface. The wafer is alternately situated under the corona gun and then under the Kelvin probe until a series of values of potentials are reached.

The mobile charge measurement is based on the difference between the actual charge required to achieve a desired potential and the theoretical amount of charge required for zero mobile charges.

SUMMARY OF THE INVENTION

A method for measuring mobile charge in a dielectric layer on a substrate includes applying at least one first polarity corona bias temperature stress cycle to the layer, applying successive second polarity corona bias temperature stress cycles to the layer and measuring a corresponding voltage drop until the voltage drops approach a terminal value, and determining the mobile charge according to the voltage drops.

The invention uses a non-contact approach to solve the MOS sample problems. No sample preparation is required and the sensitivity can be made to approach that of the MOS triangular voltage sweep method.

DESCRIPTION OF THE PREFERRED EMBODIMENTS

Figure 1:
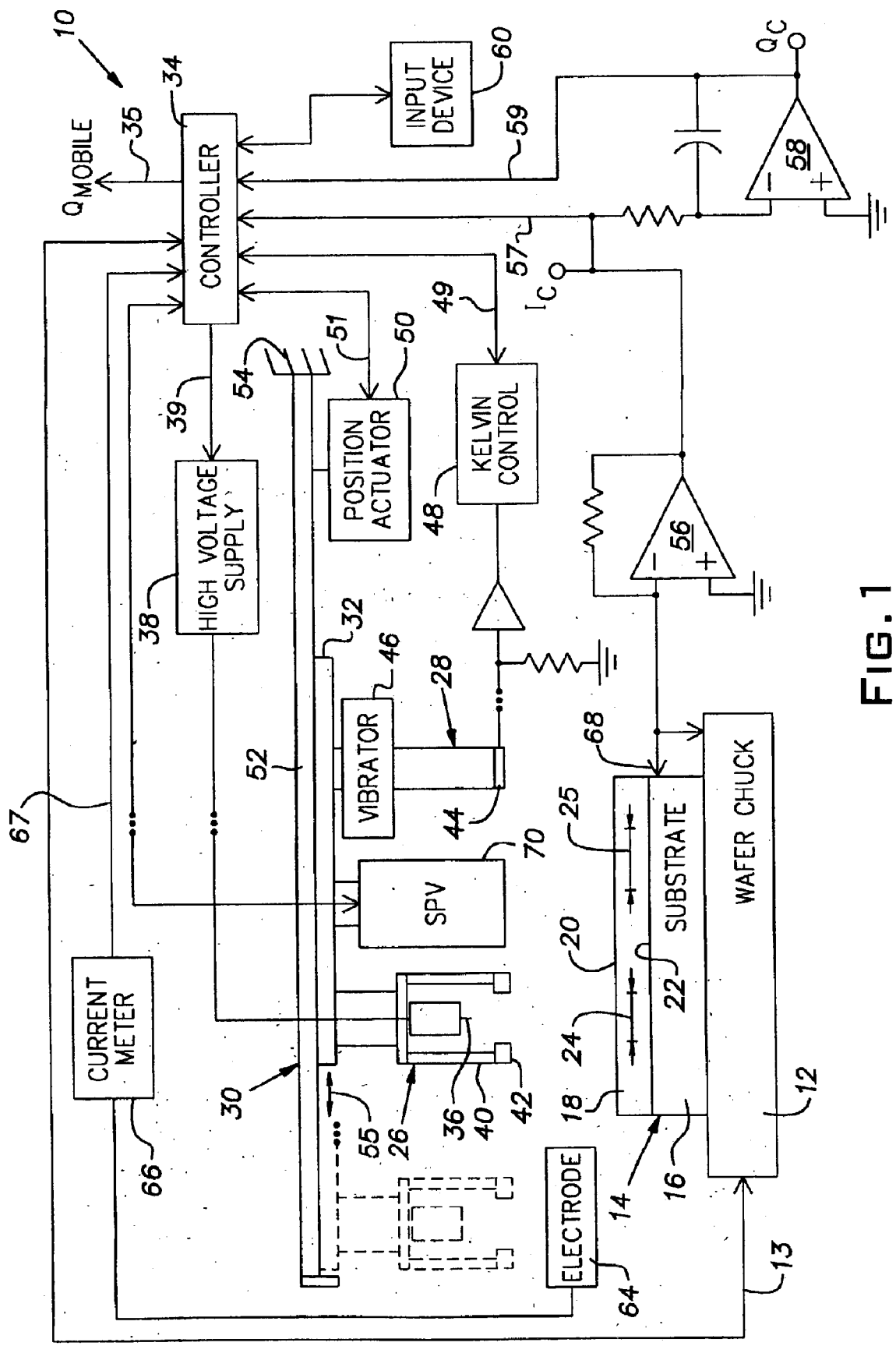
FIG. 1 is a combination block and schematic diagram of an apparatus for practicing the invention.

Referring to FIG. 1 a contactless corona-oxide-semiconductor mobile ionic charge measurement apparatus, generally referred to by numeral 10, is shown. The apparatus 10 includes, in part, a temperature controllable wafer chuck 12, for heating and cooling a semiconductor wafer 14 to be tested. The wafer 14 includes a semiconductor substrate 16 (e.g., doped silicon) having a dielectric layer 18 (e.g., silicon, dioxide) thereon. The surface of the wafer 14 also has an air/dielectric boundary surface 20 and a dielectric/substrate boundary surface 22. A measurement region 24 and a measurement region 25 depict respective regions of the dielectric layer 18 selected for testing.

A calibrated corona discharge source or corona gun 26 is, provided for depositing corona charge on the surface 20 of the dielectric layer 18. An electrostatic measurement device or Kelvin probe 28 enables a surface voltage potential of the wafer 14 to be measured. A surface photovoltage measurement (SPV) tool 70 enables the surface photovoltage of the wafer 14 to be measured. A high speed linear translational positioner 30 provides a desired positioning of the corona gun, 26, the Kelvin probe 28, and the SPV tool 70 above the dielectric layer 18 of the wafer 14. The corona gun 26, the Kelvin probe 28, and the SPV tool are suitably attached to a movable carriage 32, of the positioner 30. The apparatus 10 also includes a controller 34 for device operability.

The wafer chuck 12 may be any suitable temperature controllable wafer chuck, such as is commercially available from Temptronic Corporation of Newton, Mass. The wafer chuck 12 preferably has good electrical isolation between the chuck heating element and the top surface of the chuck to minimize any introduction of noise into measurements made by the apparatus 10. The wafer chuck 12 is connected to the controller 34 via a signal, line 13 for maintaining a desired temperature on the surface of the chuck 12 for heating the wafer 14. The wafer 14 is ohmically connected to the surface of the wafer chuck 12 by a suitable means, such as a tungsten carbide needle.

The corona gun 26 includes a corona charge depositing needle 36 (e.g., one or more tungsten carbide needles) which is connected to a high voltage supply 38. The corona gun 26 also includes an electrode housing 40, which in conjunction with the needle 36, provides a focusing of the corona discharge. To ensure charge uniformity, the needle 36 is disposed a distance above the surface of the dielectric layer 18 to ensure that fringing effects and other causes of charge deposition non-uniformity are minimized. Typically, such a distance in on the order of several centimeters above the surface 20. In addition, an aperture mask 42, having an aperture diameter on the order of two centimeters may be attached to the housing 40. The aperture mask 42 is deposed over the surface of the dielectric layer 18 with spacing on the order of 10 mils to provide good charging definition and uniformity. In addition, an unshown conductive screen may be interposed between the corona gun 26 and the wafer 14 to further enhance uniformity of charge deposition. The high voltage supply 38 provides a desired voltage output in a range from minus 10 kv to positive 10 kv for example. The high voltage supply is suitably connected to the controller 26 via an appropriate signal line 39, for a desired feedback control of the high voltage supply 38 during an operation of the apparatus 10.

The SPV tool 70 measures the voltage difference between the top surface 20 of the dielectric layer 18 and the bulk, silicon substrate 16 of the wafer 14 that is produced in response to light. SPV tools are well-known in the art and only briefly discussed herein. For instance, a typical SPV tool includes a varying intensity light source that is directable onto the test surface. This light is typically directed through a transparent electrode located within a few mils of the test surface. Any surface voltage produced by the varying light is capacitively sensed by the transparent electrode. In the present invention, the varying light source is of high intensity, for example, a xenon flash tube.

The Kelvin probe 28 includes a non-contact means for measuring the voltage difference between the top surface 20 of the dielectric layer 18 and the bulk silicon substrate 16 of the wafer 14. Kelvin probe apparatus are well-known in the art and only briefly discussed herein. For instance, a typical Kelvin probe apparatus includes a capacitive pick-up plate 44 connected to a vibrating apparatus 46. The pick-up plate 44 has a diameter on the order of 0.6 cm for example. The Kelvin probe 28 is suitably positioned above the top surface 20 of the dielectric layer 18 by the positioner 30, such that, the pick-up plate 44 is capacitively coupled to the wafer 14 across an approximate 5 mil air gap. The vibration of the pick-up plate 44 relative to the surface 20 induces a time varying charge on the surface of the pick-up plate 44, at the vibration frequency of the vibrating apparatus 46. The resultant time varying current at the vibration frequency is proportional to the potential difference between the pick-up plate 44 and the dielectric surface 20. The time varying charge on the pick-up plate 44 is coupled to a high input impedance MOSFET and subsequently to a Kelvin control 48, resulting in a voltage $V_S$ which approximates the surface voltage potential on the surface 20, relative to the underlying substrate 16. A signal line 49 connects the controller 34 Kelvin control 48, as appropriate, for control of the Kelvin control 48 and for the obtaining of surface voltage potential information during an operation of the apparatus 10. It should be noted that any other suitable non-contact electrostatic voltmeter, such as, available from Trek Corporation of Medina, N.Y., may be substituted for the Kelvin probe 28.

The positioner 30 provides a desired positioning of the corona gun 26, the SPV tool 70, and the Kelvin probe 28 above the dielectric layer 18 of the wafer 14. The positioner 30 includes a movable carriage 32 and apposition actuator 50 for controlled translational movement of the carriage 32 to a desired position or positions along a track 52 of the positioner 30. The positioner 30 may include any suitable controllable positioning means or translational stage. The actuator 50 and the track 52 may include, for example, a suitable stepper motor and worm gear, respectively. Alternatively, the actuator 50 and the track 52 may likewise include a suitable arrangement of pneumatic actuators and guide rails. The positioner 30 is suitable attached to a mechanical ground 54. The positioner 30 also may provide, for example, three dimensional translation of the corona gun 26, the Kelvin probe 28, and the SPV tool 70.

The corona gun 26, the SPV tool 70, and the Kelvin probe 28 are suitably attached to a the carriage 32 by a suitable spaced amount as shown in FIG. 1. During an operation of the apparatus 10, the corona gun 10, the SPV tool 70, and the Kelvin probe 28 are selectively positioned above the measurement region 24 (or the region 25) of the dielectric layer 18, the direction of such positioning as indicated by the arrow 55 for the case of single dimensional translation. During a corona discharge step the corona gun 26 is positioned above, and approximately, centered with respect to, the measurement region 24 (or the region 25). During a surface voltage potential measurement, the Kelvin probe is positioned above, and approximately centered with respect to, the measurement region 24 (or the region 25). During a SPV measurement, the SPV tool 70 is positioned above, and approximately centered with respect to, the measurement region 24. The actuator 50 is suitably connected to the controller 26 via an appropriate signal line 51, for a desired positioning of the corona gun 26, the SPV tool 70, and the Kelvin probe 28 during an operation of the apparatus 10.

Upon exposure of the dielectric layer 18 to a corona discharge from the corona gun 26, a corona current $I_C$ from the corona gun 26 flows into the wafer 14 and then the chuck 123 This current is converted to a voltage by an operational amplifier 56 and then integrated by an operational amplifier 58 to generate a voltage proportional to the coulombs of corona charge $Q_C$ deposited on the surface 20. The current $I_C$ is fed back to the controller 34 via a signal line 57, which in turn, provides appropriate control of the high voltage supply 38 and thus the voltage to the corona discharge needle 36, in order to form a constant corona current servo in addition, the output of the integrating amplifier 58 is connected to the controller 34 via the signal line 59 for providing deposited corona charge $Q_C$ information to the controller 34 for use during an operation of the apparatus 10.

The controller 34 provides a means for controlling the chuck 12, the corona gun 26, the SPV tool 70, the Kelvin probe 28, and the positioner 30 in a controlled manner. The controller 34 may include, for example, a computer and associated interface circuitry, a suitable programmable control device, or the like, for providing desired control, data acquisition, and data manipulation functions. Preferably, the controller 34 includes a computer and associated interface circuitry, computers and associated interface circuitry being well known in the art and only briefly discussed herein, the computer further being programmed by known techniques for performing desired functions as described herein. During a testing operation, the controller 34 generates a measurement of an amount of mobile ionic species in a dielectric layer of a wafer under test. To this end, the controller 34 may provide an output signal $Q_{Mobile}$ on a signal line 35, wherein $Q_{Mobile}$ is representative of the amount of mobile ionic species in the dielectric layer of the wafer under test. The controller 34 may also include an unshown display device for presenting an analogous indication of an amount of mobile ionic species in the dielectric layer of the wafer under test, such as, by a suitable plot or graph. In addition, an input device 60, such as a keyboard, is connected to the controller 34 for entry of information as necessary for a particular testing operation.

A corona calibration electrode 64 and current meter 66 are provided for calibrating a corona density deposited by the corona gun 26. The electrode 64 is of known dimension, such as, having a top surface of a diameter on the order of one centimeter. Furthermore, the top surface of the electrode 64 is positioned in a substantially similar plane as the top surface 20 of the dielectric layer 18. The current meter 66 is connected to the electrode 64. A signal line 67 connects the controller 34 with the current meter 66, as appropriate for control of the current meter 66 and for the obtaining of corona current information during a calibration of the corona gun 26, and further during an operation of the apparatus 10. During a calibration of the corona gun 26, the corona gun 26 is suitably positioned above the electrode 64 via the positioner 30. Under control of the controller 34, the corona gun 26 deposits charge on the electrode 64 to establish the corona charge density (e.g., coulombs/cm²) of the corona gun 26.

The apparatus 10 is used to measure the mobile ionic charge $Q_{Mobile}$ in the dielectric layer of a wafer under test. This is accomplished by subjecting the wafer 14 to a series of corona bias temperature stress cycles and making various measurements during the process.

The wafer 14 is placed on the chuck 12 with the dielectric layer 18 of interest facing away from the chuck 12. It is possible that the wafer will also have an unshown dielectric layer between the chuck 12 and the substrate 16. An ohmic contact is made between the substrate 16 and the chuck 12 with, for example, a sharp tungsten carbide needle 68. The needle 68 is typically used to scratch through any oxide, or other insulator, covering the substrate 16. The substrate 16 may be, for example, P-doped silicon and the dielectric layer 18 may be, for example, a thermal oxide such as silicon dioxide.

The corona gun 26 is used to deposit a first polarity corona charge (e.g., positive charge) on the measurement region 24 until a desired electric field is established across the layer 18. This electric field is chosen to be sufficient to move the mobile charges in the layer 18 to the dielectric/substrate boundary surface 22 during the temperature stress described below. This, field may be, for example, 2E6 volts/cm. The Kelvin probe 28 is used to establish the electric field across the layer 18 based on $V_S$ and the thickness of the layer 18. In the preferred embodiment, the corona is deposited incrementally and $V_S$ measured until the desired electric field is established.

The wafer 12 is then heated by the chuck 12 to a temperature (e.g., 200–300 degrees centigrade) for a period of time (e g., 2–3minutes) sufficient to allow the mobile charges to move to the boundary surface 22. The wafer 12 is then allowed to cool to room temperature (e.g., 20–25 degrees centigrade).

The heating and cooling the wafer 12 in the presence of corona charge on the surface 20 is referred to herein as a corona bias temperature stress cycle.

It is possible that movement of mobile charges during the first corona bias temperature stress cycle will be sufficient to reduce the electric field across the layer 18 to a value (e.g., less than 1.5E6 volts/cm) insufficient to move all of the mobile charges in the layer 18 to the dielectric/substrate boundary surface 22. If this is the case, additional corona of the first corona polarity is applied to reestablish the desired electric field across the layer 18 and another corona bias temperature stress cycle applied. This is repeated until the electric field across the layer 18, as determined by the Kelvin probe 28, remains sufficient to have moved all of the mobile charges in the layer 18 to the dielectric/substrate boundary surface 22 (e.g., greater than 1.5E6 volts/cm).

After the electric field remains sufficient to have moved all of the mobile charges to the boundary surface 22, the corona gun 26 is used to deposit corona of a second polarity (e.g., negative) on the measurement region 24, as a prelude to another corona bias temperature stress cycle. The desired second polarity corona charge electric field is chosen to be sufficient to move the mobile charges in the layer 18 to the air/dielectric boundary surface 20. This field may be, for example, −0.2E6 volts/cm. The wafer 12 is heated to, for example, 200–300 degrees centigrade for about a minute. The Kelvin probe 28 is used to measure $V_S$ after the corona is deposited and again at the completion of the corona bias temperature stress cycle. The voltage drop $\Delta V_S$ between the last corona deposit and the completion of the corona bias temperature stress cycle is determined.

It is possible that movement of mobile charges during the first second polarity corona bias temperature stress cycle will be sufficient to reduce the electric field across the layer 18 to a value (e.g., more positive than −0.1E6 volts/cm) insufficient to move all of the mobile charges in the layer 18 to the air/dielectric boundary surface 20. If this is the case, additional second polarity corona charge (e.g., negative) is applied to reestablish the desired electric field across the layer 18 and another corona bias temperature stress cycle applied. The voltage drop $\Delta V_S$ is again determined. This is repeated until the electric field across the layer 18, as determined by the Kelvin probe 28, remains sufficient to move all of the mobile charges in the layer 18 to the boundary surface 20 (e.g., more positive than −0.1E6 volts/cm).

If it is assumed the change in the surface potential $\Delta V_S$ is just a result of the movement of mobile ion charges, $\Delta V_S$ can be used to determine $Q_{Mobile}$ from 1/q times $C_{OX}$ times the sum of the $\Delta V_S$ values, where q is the 1.6E-19 coulombs/unit charge and $C_{OX}$ is the capacitance per unit area of the dielectric (e.g., 3.45E-8 farads/cm² for 1,000 Å thick silicon dioxide). However, this assumption severely limits the accuracy and usefulness of this method of determining $Q_{Mobile}$.

Ideally, $\Delta V_S$ can be completely attributed to a momentary ionic current across the dielectric. However, there will also be some degree of leakage current (aggravated by the elevated temperature used for the corona bias temperature stress cycle) across the dielectric that will add to the apparent value of this ionic current. While the wafer is at elevated temperatures during a corona bias temperature stress cycle, the integral over time of the leakage current will produce a voltage drop $\Delta V_{Leakage}$ which will additively contribute to the measured $\Delta V_S$.

Also, $\Delta V_S$ is affected by any change in dipoles on the surface of the dielectric. Dipoles will normally exist on the dielectric surface, due to adsorbed molecules from the room ambient. In general, such gaseous adsorption is favored at a solid gas interface, due to accompanying losses in surface free energy as well as decreases in entropy. There are basically two types of adsorption, chemical adsorption (chemisorption) and physical adsorption. In chemisorption, often, the first monolayer of gaseous molecules on a solid surface will have tended to form chemical bonds, in order to satisfy unsaturated surface bonds. In physical adsorption, multiple layers of gaseous molecules can build up on a surface due to Van der Waals forces. Any charge transfer that takes place during such gaseous adsorption can lead to surface potentials, which can be electrically likened to a battery sitting on the dielectric surface. Any changes in this surface dipole potential $\Delta V_{Dipole}$ during a corona bias temperature stress cycle can cause an additive error in $\Delta V_S$.

Additionally, as corona charge is applied to the dielectric, the electric field lines, from the corona charge will tend to penetrate into the substrate 16. This field penetration into the silicon will lead to changes in the silicon surface potential $V_{Si}$ resulting in "band bending" error. The least worrisome case for the changes in $V_{Si}$ is when the silicon is in a state of being accumulated (e.g., negative corona over a P-type silicon surface). Here, the changes in $V_{Si}$ may only be on the order of tens of millivolts. The worst case for these $V_{Si}$ changes is when the silicon is in a state of depletion (and not yet inverted). Here, the changes in $V_{Si}$, $\Delta V_{Si}$ may be on the order of hundreds of millivolts.

These changes in $V_{Si}$ become more of a source of error when the oxide is very thin (e.g., less than 500 Å) For such thin oxides, a given increment in corona charge or a given change in corona bias temperature stress induced oxide charge (not $Q_{Mobile}$) might cause $\Delta V_{Si}$ to actually be greater than $\Delta V_S$.

The present invention includes steps for correcting the value of $\Delta V_S$ (and therefore $Q_{Mobile}$) for the effects of $\Delta V_{Dipole}$, $\Delta V_{Si}$ and $\Delta V_{Leakage}$.

As a correction for $\Delta V_{Dipole}$, each of the successive second polarity corona bias temperature stress cycles are chosen to be of substantially equal time. This results in $\Delta V_{Dipole}$ being minimized and thus less potential error in $Q_{Mobile}$. This is because $V_{Dipole}$ tends to recover to a prior equilibrium value over a time span (e.g., 1–2 hours).

As another correction for $_{\Delta VDipoles}$, a $V_{Dipole}$ monitoring site is created by depositing second polarity (e.g., negative) corona charge with the corona gun 26 onto the measurement region 25 before a first polarity corona bias temperature stress cycle is run on the measurement region 24. The second polarity corona, charge is applied until a desired electric field (e.g., 0.2E6 volts/cm) is established across the layer 18 at the region 25. After completion of the first polarity corona bias temperature stress cycle(s) at the region 24, the electric field across the layer 18 at the region 25 is reduced to a value substantially weaker (e.g., –0.05E6 to –0.1E6 volts/cm) than the desired value for second polarity corona bias temperature stress cycles at the region 24 by application of first polarity corona charge with the corona gun 26. The Kelvin probe 28 is used to measure $V_{S2}$ at the region 25 before and after each second polarity corona bias temperature stress cycle at the region 24. The value(s) of $\Delta V_S$ is then corrected by subtracting the change in $V_{S2}$ from each $\Delta V_S$ with the controller 34, resulting in a corrected $Q_{Mobile}$.

This is because the contribution of $\Delta V_{Dipole}$ tends to be independent of the electric field across the oxide. The monitoring site at the region 25 will have the mobile ions continuously at the surface 10 (i.e., no push-down field was applied) and the reduced field will minimize leakage current, therefore, the voltage drop $\Delta V_{S2}$ for each corona bias temperature stress cycle corresponds to $\Delta V_{Dipole}$. It is noted that since a low electric field is used to measure $\Delta V_{S2}$ at the $V_{Dipole}$ monitoring site, $\Delta V_{Si}$ may not be constant. Therefore, further improvement of the estimate of $\Delta V_{Dipole}$ can be made by using the $\Delta V_{Si}$ correction technique described below to $\Delta V_{S2}$ at the $V_{Dipole}$ monitoring site.

As a correction for $\Delta V_{Si}$, the SPV tool 70 is used to make an SPV measurement before and after each second polarity corona bias temperature stress cycle. The difference between each pair of SPVs is used as an estimate of $\Delta V_{Si}$ which is then subtracted from $\Delta V_S$ by the controller 34 to provide a corrected value for $Q_{Mobile}$.

The light intensity of the SPV tool 70 must be sufficient for creating a concentration of excess light induced carriers that is comparable to or greater than the doping concentration of the wafer (e.g., 1E15 carriers/cm$^3$). The excess carriers (electrons and holes) will separate in the silicon surface field, due to $V_{Si}$, and then set up an opposing field that will tend to reduce $V_{Si}$ toward zero. Therefore, the magnitude of the SPV (actually, the change in $V_{Si}$) will tend to be a significant fraction of $V_{Si}$. For silicon, in the depletion regime, the SPV can be as much as 80% of $V_{Si}$. For the accumulation regime, the SPV will tend to be about 30% of $V_{Si}$.

For a given value of SPV and a reasonably estimated value of excess optically induced carrier generation, delta n, there will be an approximate corresponding value of $V_{Si}$ that can be calculated from a theoretical model, such as that of E. O. Johnson, Phys. Rev., Vol. 111, No. 1. The first order effect in the Johnson model is that the magnitude of SPV tends to approach $V_{Si}$ as delta n becomes comparable to and larger than the silicon doping concentration. It is noted that delta n can also be estimated from Johnson, based on a SPV measurement in strong accumulation and in strong inversion.

To provide a correction for $\Delta V_{Leakage}$, second polarity corona bias temperature stress cycles are applied to the wafer 14 at the region 24, until the corresponding values for $\Delta V_S$ approach a terminal value, $\Delta V_{Terminal}$. Estimates for the terminal $\Delta V_{Dipole}$ and the terminal $\Delta V_{Si}$ (e.g., from the above described methods) are subtracted from $\Delta V_{Terminal}$ to provide an estimate for $\Delta V_{Leakage}$. The value(s) of $\Delta V_S$ is then corrected by subtracting $\Delta V_{Leakage}$ from each $\Delta V_S$ by the controller 34 and a corrected $Q_{Mobile}$ is provided.

This is because after the first one or two second polarity corona bias temperature stress cycles, all the second polarity mobile ions will have moved to the surface 20 (particularly for sodium ions). The ideal terminal value of $\Delta V_S$ would be essentially zero. However, due to the aforementioned error factors, $\Delta V_{Terminal}$ will usually be a non-zero value that will correspond to the sum of the terminal values of $\Delta V_{Leakage}$, $\Delta V_{Dipole}$ and, $\Delta V_{Si}$. Prior to attaining the $\Delta V_{Terminal}$ condition, the successive values of $\Delta V_S$ will equal the sum of the corresponding oxide voltage drop due to mobile ions, $\Delta V_{OX}$, along with the corresponding $\Delta V_{Leakage}$ and $\Delta V_{Dipole}$. Fortunately however, $\Delta V_{Leakage}$ can usually be assumed to be constant for each successive second polarity corona bias temperature stress cycle as the bias field is essentially the same for each cycle (i.e., the terminal value of $_{\Delta VLeakage}$ can be used for all values of $\Delta V_{Leakage}$).

To provide another correction for $_{\Delta VLeakage}$, before each second polarity corona bias temperature stress cycle, the amount of corona charge necessary to bias the portion of the substrate 16 below the region 24 from midband condition to the desired second polarity corona charge electric field (pull-up condition) is determined from $Q_C$. After each second polarity corona bias temperature stress, the amount of corona charge necessary to bias the portion of the substrate 16 below the region 24 back to midband condition is determined from $Q_C$. The difference between these two amounts of charge, $Q_{Restore}$, provides a measure of $\Delta V_{Leakage}$ where $\Delta V_{Leakage}$ is equal to $Q_{Restore}$ divided by $C_{OX}$. The value(s) of $\Delta V_S$ is then corrected by, subtracting $\Delta V_{Leakage}$ from each $\Delta V_S$ with the controller 34 and a corrected $Q_{Mobile}$ is provided.

The midband condition for the substrate, 16 may be determined with the SPV tool 70. For example, for 10–20 ohm-cm silicon, the midband SPV would be –0.3 volts. As corona charge is incrementally deposited by the corona gun 26, the SPV tool 70 is used to identify the midband condition.

This correction comes about because changes in dielectric surface dipole potentials, after a corona bias temperature stress cycle, tend to be accompanied by no net change in net oxide surface charge. Consequently, there is no accompanying change in silicon imaging charge, assuming no net change in oxide/Si interface states occupancy after a corona bias temperature stress cycle. In contrast, for leakage, there is a net change in oxide surface charge and silicon image charge that can be accounted for with $Q_{Restore}$.

The above methods for determining and correcting $Q_{Mobile}$ can also be advantageously combined. Corrections for $\Delta V_{Leakage}$, $\Delta V_{Dipole}$ and $\Delta V_{Si}$ determined from the above methods can, for example, be each used in any desired combination and, in the case of multiple corrections for the same error mechanism, averaged or otherwise weighted. In addition the values for $\Delta V_{Leakage}$, $\Delta V_{Dipole}$ and $\Delta V_{Si}$ can be fitted to theoretical models, and corrections therefrom applied to $Q_{Mobile}$.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A method for measuring mobile charge in a dielectric layer on a substrate, said method comprising:

applying at least one first polarity corona bias temperature stress cycle to said layer;

applying successive second polarity corona bias temperature stress cycles to said layer and measuring a corresponding voltage drop;

creating a dipole potential monitoring site on said layer with a second polarity corona prior to at least one first polarity corona bias temperature stress cycle;

measuring a dipole site voltage at said site before and after at least one second polarity corona bias temperature stress cycle; and determining said mobile charge according to said voltage drops and said dipole site voltages.

* * * * *